(12) United States Patent
Murin et al.

(10) Patent No.: US 7,730,368 B2
(45) Date of Patent: Jun. 1, 2010

(54) METHOD, SYSTEM AND COMPUTER-READABLE CODE FOR TESTING OF FLASH MEMORY

(75) Inventors: Mark Murin, Kfar Saba (IL); Menahem Lasser, Kohav-Yair (IL); Avraham Meir, Rishon Lezion (IL)

(73) Assignee: Sandisk IL Ltd., Kfar Saba (IL)

( * ) Notice: Subject to any disclaimer, the term of this patent is extended or adjusted under 35 U.S.C. 154(b) by 938 days.

(21) Appl. No.: 11/397,578

(22) Filed: Apr. 5, 2006

(65) Prior Publication Data

US 2006/0216841 A1     Sep. 28, 2006

Related U.S. Application Data

(63) Continuation-in-part of application No. 10/697,981, filed on Oct. 31, 2003, now Pat. No. 7,424,659.

(60) Provisional application No. 60/731,921, filed on Nov. 1, 2005.

(51) Int. Cl.
*G11C 29/00* (2006.01)
*G11C 7/00* (2006.01)
(52) U.S. Cl. .................................. 714/718; 365/201
(58) Field of Classification Search .............. 714/718; 365/200–201
See application file for complete search history.

(56) References Cited

U.S. PATENT DOCUMENTS

| 4,333,142 | A |   | 6/1982  | Chesley |
| 5,434,825 | A |   | 7/1995  | Harari |
| 5,525,971 | A |   | 6/1996  | Flynn |
| 5,566,303 | A |   | 10/1996 | Tashiro et al. |
| 5,566,344 | A | * | 10/1996 | Hall et al. ............... 712/37 |
| 5,598,573 | A | * | 1/1997  | Hall et al. ............... 711/111 |
| 5,606,710 | A | * | 2/1997  | Hall et al. ............... 712/38 |
| 5,613,144 | A | * | 3/1997  | Hall et al. ............... 712/43 |
| 5,623,686 | A | * | 4/1997  | Hall et al. ............... 712/32 |
| 6,009,539 | A |   | 12/1999 | Ranson |

(Continued)

OTHER PUBLICATIONS

"An overview of flash architectural developments" by Campardo et al. Proceedings of the IEEE Publication Date: Apr. 2003 vol. 91, Issue: 4 on pp. 523-536 ISSN: 0018-9219 INSPEC Accession No. 7651092.*
U.S. Appl. No. 11/326,336, filed Jan. 2006, Lasser.

*Primary Examiner*—Cynthia Britt
(74) *Attorney, Agent, or Firm*—Toler Law Group

(57) ABSTRACT

Methods, systems and devices for testing flash memory dies are disclosed. According to some embodiments, during the post-wafer sort stage of device manufacture, a plurality of flash memory devices, each of which includes a flash controller die and at least one flash memory die associated with a common housing, are subjected to a testing process, for examples, a batch testing process or a mass testing process. During testing, a respective flash controller residing on a respective flash controller die executes at least one test program to test one or more respective flash memory dies of the respective flash device. A testing system including at least 100 of the flash memory devices and a mass-testing board is disclosed. Furthermore, flash memory devices where the flash controller is operative to test one or more of the flash memory dies are disclosed. Exemplary testing includes but is not limited to bad block testing.

21 Claims, 5 Drawing Sheets

U.S. PATENT DOCUMENTS

| | | |
|---|---|---|
| 6,151,692 A | 11/2000 | Smitlener et al. |
| 6,198,663 B1 | 3/2001 | Takizawa |
| 6,311,273 B1 | 10/2001 | Helbig et al. |
| 6,426,893 B1 | 7/2002 | Conley et al. |
| 6,636,825 B1 | 10/2003 | Malladi et al. |
| 6,797,538 B2 * | 9/2004 | Wallace ..................... 438/109 |
| 6,832,348 B2 | 12/2004 | Kawabe |
| 2002/0174382 A1 | 11/2002 | Ledford et al. |
| 2005/0149780 A1 | 7/2005 | Avraham |
| 2005/0156165 A1 | 7/2005 | Eldridge et al. |

* cited by examiner

METHOD, SYSTEM AND COMPUTER-READABLE CODE FOR TESTING OF FLASH MEMORY

CROSS-REFERENCE TO RELATED APPLICATIONS

This patent application claims the benefit of U.S. Provisional Patent Application No. 60/731,921, filed Nov. 1, 2005 by the present inventors, and is a continuation-in-part of U.S. patent application Ser. No. 10/697,981, filed Oct. 31, 2003 now U.S. Pat. No. 7,424,659, by one of the present inventors.

FIELD OF THE INVENTION

The present invention relates to the manufacture of flash memory devices in general, and to the testing of flash memory dies during manufacture in particular.

BACKGROUND

Single Bit and Multi-Bit Flash Memory Cells

Flash memory devices have been known for many years. Typically, each memory cell within a flash memory device stores one bit of information. The traditional way to store a bit in a flash memory cell has been by supporting two states of the memory cell. One state represents a logical "0" and the other state represents a logical "1".

In a flash memory cell, the two states are implemented by having a floating gate situated above the cell's channel (the area connecting the source and drain elements of the cell's transistor), and having two valid states for the amount of charge stored within the floating gate. Typically, one state is with zero charge in the floating gate and is the unwritten state of the cell after being erased (commonly defined to represent the "1" state) and the other state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. It is possible to read the stored bit by checking the threshold voltage of the cell. If the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For this purpose it is sufficient to compare the threshold voltage of the cell to a reference voltage that is between the two states, and to determine if the cell's threshold voltage is below or above the reference value.

FIG. 1A (prior art) shows graphically how this works. Specifically, FIG. 1A shows a distribution of the threshold voltages of a large population of cells. Because the cells in a flash device are not exactly identical in their characteristics and behavior (due to, for example, small variations in impurity concentrations or defects in the silicon structure), applying the same programming operation to all of the cells does not cause all of the cells to have exactly the same threshold voltage. Instead, the threshold voltage is distributed as shown in FIG. 1A. Cells storing a value of "1" typically have a negative threshold voltage, such that most of the cells have a threshold voltage close to the central voltage value of the left peak (labeled 1) of FIG. 1A, with fewer cells having threshold voltages lower or higher than the central voltage of the left peak. Similarly, cells storing a value of "0" typically have a positive threshold voltage, such that most of the cells have a threshold voltage close to the central voltage of the right peak (labeled 0) of FIG. 1A, with fewer cells having threshold voltages lower or higher than the central voltage of the right peak.

In recent years, a new kind of flash device has appeared on the market, using "Multi Level Cells" (MLC). The term "Multi-Level Cell" is misleading because flash memory with a single bit per cell uses multiple i.e. two levels, as described above. Therefore, the term "Single Bit Cell" (SBC) is used hereinafter to refer to a memory cell of two levels and the term "Multi-Bit Cell" (MBC) is used hereinafter to refer to a memory cell of more than two levels, i.e. more than one bit per cell. The most common MBC flash memories at present are ones with two bits per cell, and therefore examples are given below using such MBC memories. It should however be understood that the present invention is equally applicable to flash memory devices that support more than two bits per cell. A single MBC cell storing two bits of information is in one of four different states. As the cell's "state" is represented by the cell's threshold voltage, an MBC cell supports four different valid ranges for the cell's threshold voltage. FIG. 1B (prior art) shows the threshold voltage distribution for a typical MBC cell of two bits per cell. As expected, FIG. 1B has four peaks, each peak corresponding to one state. As for the SBC, each state is actually a voltage range and not a single voltage. When reading the cell's contents, the cell's threshold voltage must be correctly identified in a definite voltage range. For a prior art example of an MBC flash device see U.S. Pat. No. 5,434,825 to Harari that is included by reference for all purposes as if fully set forth herein.

A cell designed for MBC operation e.g. in four states is typically operable as an SBC cell with two states. For example, Conley et al. in U.S. Pat. No. 6,426,893 incorporated by reference for all purposes as if fully set forth herein, disclosed the use of both MBC and SBC modes within the same device, and selecting certain parts of the device to operate with highest density in MBC mode, while other parts are used in SBC mode to provide better performance.

MBC devices provide a significant cost advantage. An MBC device with two bits per cell requires about half the area of a silicon wafer than an SBC of similar capacity. However, there are drawbacks to using MBC flash. Average read and write times of MBC memories are longer than of SBC memories, resulting in worse performance. Also, the reliability of MBC is lower than SBC. The differences between the threshold voltage ranges in MBC are much smaller than in SBC. Thus, a disturbance in the threshold voltage (e.g. leakage of stored charge causing a threshold voltage drift or interference from operating neighboring cells) that are insignificant in SBC because of the large gap between the two states, may cause an MBC cell to move from one state to another, resulting in an erroneous bit. The end result is a lower performance specification of MBC cells in terms of data retention time or the endurance of the device to many write/erase cycles.

Another ramification of the lower reliability of MBC devices compared to SBC devices is the required level of error correction. Manufacturers of SBC NAND flash devices typically advise users to apply an Error Correction Code (ECC) capable of correcting 1 bit error in each page of 512 bytes of data. But data sheets of MBC NAND flash devices typically advise applying an ECC capable of correcting 4 bit errors in each page of 512 bytes of data. For pages of size 2048 bytes such as in the case of NAND devices known as "large block devices", the suggestion is to apply error correction per each portion of 512 bytes of the page. The present invention applies to all types of flash devices, regardless of page size. In this application the term "N-bit ECC" refers to an ECC scheme capable of correcting N bit errors in 512 bytes of data, regardless if the 512 bytes are the size of one page, less than one page, or more than one page.

Testing of Flash Memory Dies

Flash memory dies require extensive testing before being put to use in a product. This is especially true for NAND flash. One reason for this is that the flash device might have bad blocks that should not be used. A block is the smallest chunk of cells that can be erased in a single erase operation, and it typically contains many pages, where a page is the smallest chunk of cells that can be written in a single write operation. If a block cannot be reliably erased to the all "1" state or if one or more pages of the block cannot be reliably programmed, then the block should be either replaced by another block by physically trimming the die or be marked as a bad block so that software writing to the device will be able to avoid using it.

A given flash memory die may be subjected to other tests, but the testing for bad blocks is typically the most time consuming. This is because testing for bad blocks typically involves writing to each and every page and erasing each and every block of the device. The writing and erasing is typically repeated more than once in order to make the bad blocks testing under different patterns of written data, under different temperatures, or under other variations of testing parameters.

Testing During the Wafer Sort Stage of Manufacturing

In some cases the full testing of a flash memory die is completed while the die is still part of the silicon wafer in which it was manufactured, and before the wafer is separated into multiple dies. This stage is typically called the "wafer sort" stage. Such dies that completed their testing in the wafer sort stage are typically called Known Good Dies ("KGD"). The use of KGD flash memory dies is advantageous when the flash memory die is assembled into a Multi-Chip Package ("MCP") with an expensive second die such as a microprocessor. If the memory dies are not fully tested before the MCP assembly, then their testing is completed after the memory and microprocessor are assembled together into one device. Then if some of the memory dies are found defective at the MCP-stage testing, those MCP devices have to be scrapped. This causes the loss of not only the memory die (that would have been scrapped anyway), but also the expensive microprocessor die and the cost of packaging.

However, manufacturing KGD flash memory dies is not simple. The test equipment used for the wafer sorting stage is complex and expensive, using such equipment for long tests makes the costs of testing high. Also, bad blocks testing is not well suited for execution of the tests on many dies in parallel at the wafer sort stage. Unlike typical signal timing tests where all tested dies in the wafer go through exactly the same test sequences and the result of the test is a "go/nogo" decision for each die, in bad blocks testing each die might have bad blocks in different locations, and exhibit different timing while testing, and therefore the testing equipment should handle each die separately. This further complicates bad blocks testing at wafer sort stage and makes it more costly.

One other factor is even more significant in further increasing the costs of bad blocks testing at wafer sort stage. Many flash memory manufacturers require the tests to be done in temperatures different from room temperature. This means the wafer sort testing equipment should be able to conduct the testing while the tested wafer is kept in a specified temperature. This further increases the costs of the testing equipment and consequently the testing costs per die.

Testing of Flash Memory Dies within Packaged Devices During Manufacturing

Because of the above, most flash memory dies are not manufactured as KGD. Instead the testing of the flash devices is divided into two parts. In the wafer sort stage only minimal tests are done, with the goal being to identify dies that are clearly bad and can be immediately discarded. Then the wafer is cut into separate dies and each die is packaged into the type of device package in which it will be sold. For NAND flash devices this is typically a TSOP, BGA or an LGA package, packages which are commonly used in electronic assemblies and Printed Circuit Boards (PCB). The rest of the testing, including the time-consuming bad blocks testing, is done on the packaged flash devices during a later stage (i.e. after the wafer sort stage) of manufacturing. Thus, any packaged devices are installed on a testing board (i.e. within the device-manufacturing facility), and the remaining tests are then executed. When testing packaged devices there is no need for expensive probing equipment, like the type needed for wafer sorting, as the flash devices can be conveniently handled and interfaced to, unlike the wafer sorting stage where access to the dies within the wafer is difficult.

However, even if packaged in a convenient package, testing of NAND flash devices for bad blocks is quite an expensive task. The reason for this is that due to the requirement for separate handling of each device (as explained above) the testing should be performed using expensive memory testers, which are capable of testing only a limited number of devices at the same time (typically about 100), and since the test time for each device is significant, so is the cost of testing. This is illustrated as a block diagram in FIG. 2.

Thus, referring to FIG. 2, it is noted that a flash memory device 110A to be tested is coupled to the memory tester 106. The flash memory device 110A includes a flash controller (including a processor 104) residing on a flash controller die 102, and a flash memory (including a plurality of memory cells) residing on one or more flash memory dies 100. Thus, the flash controller and the flash memory are on distinct dies. The memory tester 106 includes a processor 108. A testing program is executed by the memory tester 106 (in some examples, the testing program is also stored in non-volatile memory of the memory tester 106). The testing program, which is operative to test the flash memory die 100 (for example, individual memory cells of the flash memory die 100) is executed by the general purpose processor 108 which resides within the memory tester. Within FIG. 2, the processor 108 which executes the test program is marked with an asterisk. Although only a single flash memory device is depicted in FIG. 2, it is understood that typically, a plurality of devices (as mentioned above, typically about 100) are tested together in a batch (i.e. substantially simultaneously).

In general, it is noted that testing of MBC flash devices takes longer than testing SBC flash devices. This is especially true for bad blocks testing. This is because flash operations, and especially write operations, are much slower in MBC flash. Bad blocks testing requires many such operations, as typically each page in the device is written multiple times during the test. As the number of bits per cell in the MBC flash gets higher, the write operations become slower. So testing an SBC flash device is faster than testing a two-bits-per-cell MBC flash device, which in turn is faster than testing a four-bits-per-cell MBC flash device (assuming all devices have the same number of cells). With the increased use of MBC devices, this implies that costs of flash testing are increasing.

It would therefore be highly advantageous to have a systems and methods for testing flash memory devices in a cost effective manner. It would highly advantageous to have novel flash memory devices that can conveniently be tested in a cost-effective manner.

SUMMARY OF THE INVENTION

The aforementioned needs are satisfied by several aspects of the present invention.

In accordance with some embodiments of the present invention, it is now being disclosed for the first time that, surprisingly, it is possible to reduce the costs of flash memory device testing by offloading the tests from the test equipment, and thus to eliminate the need for extensive use of expensive memory testers. In particular, this may be accomplished by configuring the flash controller of the flash device to execute (i.e. during the 'post-wafer sort' stage of manufacturing), test programs that are typically executed by the aforementioned memory testers.

It is noted that device testing is an important stage of manufacturing, and that methods, systems and devices provided by certain embodiments of the present invention are useful for reducing the cost of device manufacturing in general, and the testing phase of device manufacturing in particular.

It is now disclosed for the first time a method of device manufacturing comprising: (a) fabricating a plurality of flash memory devices, each flash memory device including (i) a respective flash memory residing on at least one respective flash memory die and (ii) a respective flash controller residing on a flash controller die separate from the respective at least one flash memory die, the respective at least one flash memory die and the respective flash controller die being associated with a respective common housing, and (b) subjecting the plurality of fabricated flash memory devices to a testing process wherein each flash memory controller executes at least one test program to test at least one respective flash memory die.

According to some embodiments, the testing process is a mass testing process.

According to some embodiments, the subjecting of the flash memory devices to the mass testing process includes coupling the plurality of flash memory devices to a single testing board, and using the testing board to deliver electrical power to the plurality of flash memory devices.

According to some embodiments, the presently disclosed method further comprises the step of: c) subsequent to the testing process, selling the plurality of flash memory devices as original equipment.

According to some embodiments, each flash memory device is fabricated as a respective multi-chip package.

According to some embodiments, each flash memory device is fabricated as a respective memory card.

According to some embodiments, each of the flash memory controller and flash memory is provided within a common respective multi-chip packaging.

According to some embodiments, each flash memory of a respective flash memory device comprises a plurality of flash memory dies, and each respective flash controller tests a respective plurality of flash memory dies by executing the at least one test program.

According to some embodiments, for each flash memory device, a respective flash controller and a respective at least one flash memory die are provided on a respective common printed circuit board.

According to some embodiments, for each flash memory device, at least one test program resides at least in part within non-volatile memory of a respective flash controller.

According to some embodiments, for each flash memory device, the test program resides at least in part within the respective flash memory.

According to some embodiments, at least one test program executed by each flash controller identifies bad blocks in the respective flash memory.

According to some embodiments, at least one test program executed by each flash controller effects bad block testing of a majority of memory cells of a respective flash memory.

According to some embodiments, at least one test program executed by each flash controller effects bad block testing of a large majority of memory cells of a respective flash memory.

According to some embodiments, at least one test program executed by each flash controller effects bad block testing of substantially all memory cells of a respective flash memory.

According to some embodiments, at least one test program executed by each flash controller tests memory cells of a respective flash memory in a multi bit per cell mode.

According to some embodiments, the execution of the at least one test program includes: i) determining if error correction was successful during a flash memory operation; and ii) in the event that the determining indicates an error correction failure, recording a test failure.

It is now disclosed for the first time a testing system comprising: a) a plurality of at least 100 flash memory devices, each flash memory device including a respective flash memory residing on a respective at least one flash memory die and a respective flash controller residing on a respective flash controller die separate from the respective at least one flash memory die, the respective at least one flash memory die and the respective flash controller die being associated with a common respective housing, each flash memory controller operative to execute at least one test program to test a respective at least one flash memory die; and b) a mass-testing board having at least 100 ports configured to supply electrical power to the flash memory devices such that each port supplies electrical power to a respective flash memory device.

According to some embodiments, at least one test program executed by each flash controller is operative to effect bad block testing of a majority of memory cells of a respective flash memory.

According to some embodiments, at least one test program executed by each flash controller is operative to effect bad block testing of a large majority of memory cells of a respective flash memory.

According to some embodiments, at least one test program executed by each flash controller is operative to effect bad block testing of substantially all memory cells of a respective flash memory.

According to some embodiments, the system is operative to test the plurality of at least 100 flash memory devices substantially simultaneously.

It is now disclosed for the first time a flash memory device comprising: a) a flash memory residing on at least one flash memory die; and b) a flash controller residing on a flash controller die separate from the at least one flash memory die, wherein: i) the flash memory and the flash controller are associated with a common housing, and ii) the flash controller is configured to execute at least one test program to test the at least one flash memory die only a pre-determined number of times.

It is now disclosed for the first time a flash memory device comprising: a) a flash memory residing on at least one flash memory die; and b) a flash controller residing on a flash controller die separate from the at least one flash memory die, wherein: i) the flash memory and the flash controller are associated with a common housing, and ii) the flash controller is configured to execute at least one test program to test at least one flash memory die and to record at least some test results within the flash memory.

It is now disclosed for the first time a flash memory device comprising a) a flash memory residing on at least one flash memory die; and b) a flash controller residing on a flash controller die separate from the at least one flash memory die, wherein: i) the flash memory and the flash controller are associated with a common housing, and ii) the flash controller is configured to effect bad block testing of a majority of memory cells of the flash memory.

These and further embodiments will be apparent from the detailed description and examples that follow.

DETAILED DESCRIPTION OF THE INVENTION

The present invention will now be described in terms of specific, example embodiments. It is to be understood that the invention is not limited to the example embodiments disclosed. It should also be understood that not every feature of the methods of flash memory device manufacturing, systems for testing flash memory devices and flash memory devices described is necessary to implement the invention as claimed in any particular one of the appended claims. Various elements and features of devices are described to fully enable the invention. It should also be understood that throughout this disclosure, where a process or method is shown or described, the steps of the method may be performed in any order or simultaneously, unless it is clear from the context that one step depends on another being performed first.

Flash Memory Device 110 and the Testing System

Figure 1A:
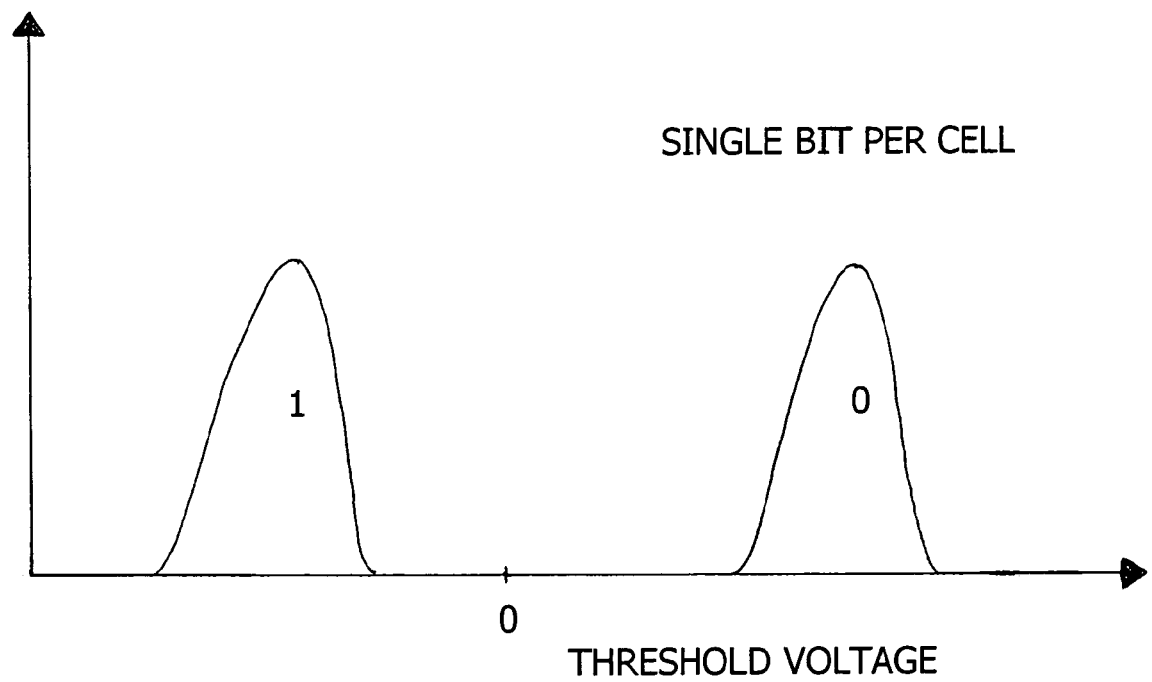
FIGS. 1A-1B provide a graphical illustration of distributions of thresholds voltages of a large population of memory cells (prior art).
Figure 1B:
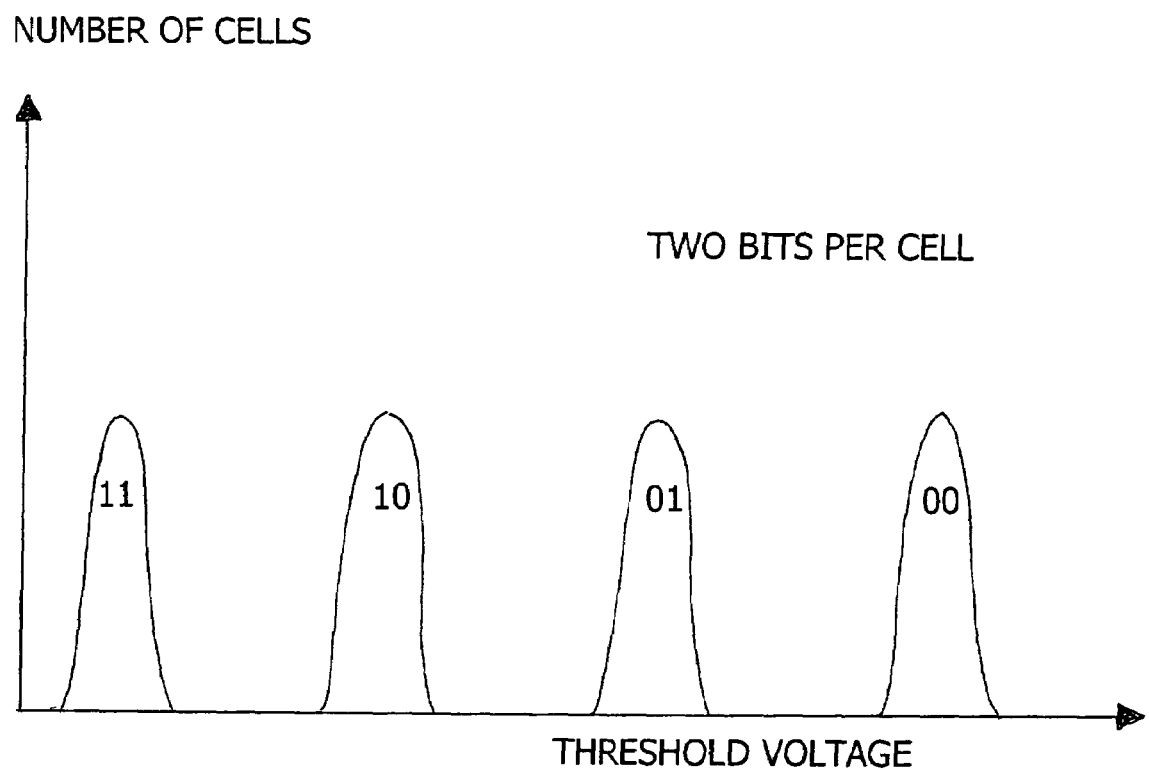
Figure 2:
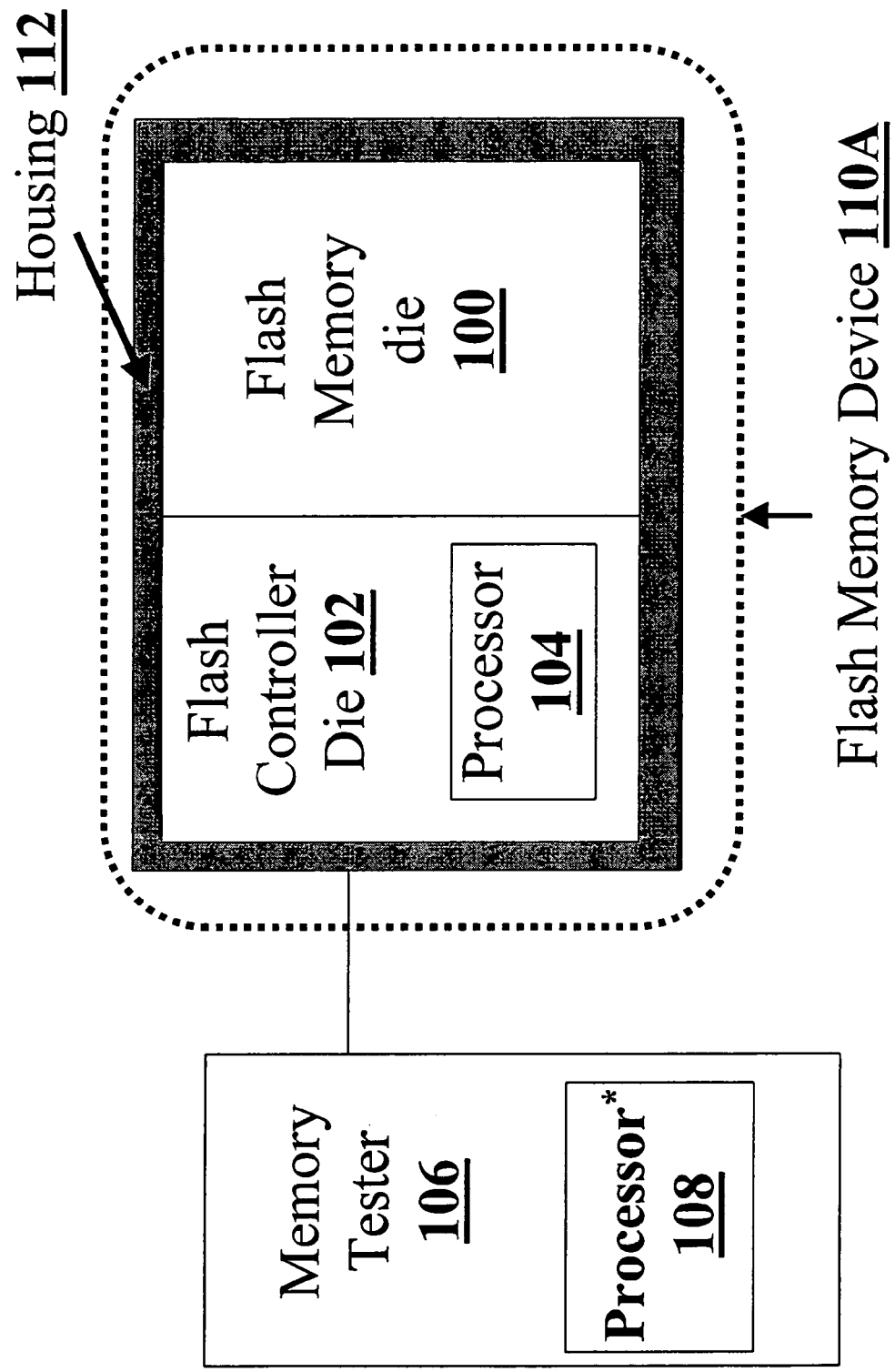
FIG. 2 provides a block diagram of a prior art system for testing flash memory devices.
Figure 3:
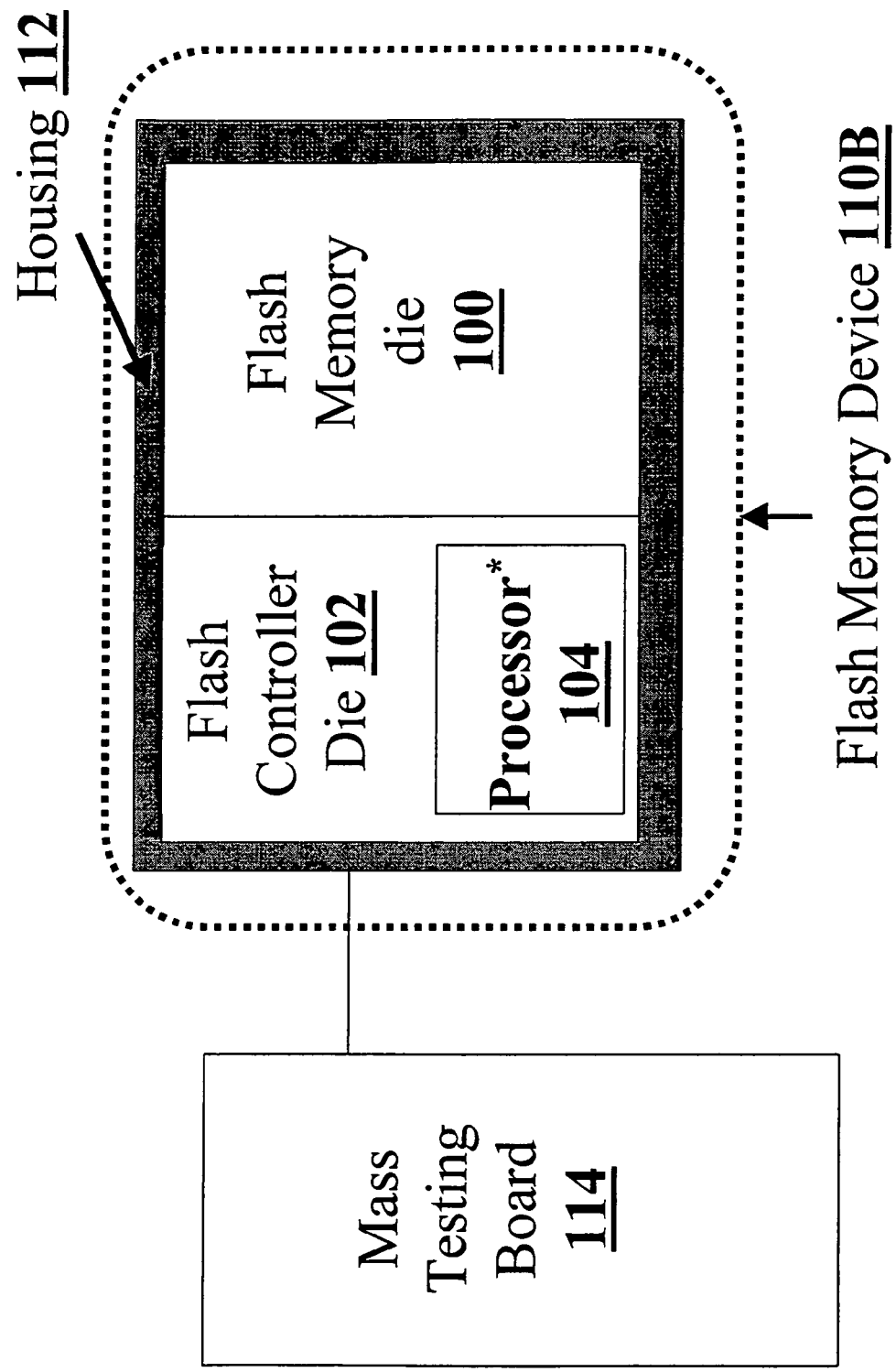
FIG. 3 provides a block diagram of a system for testing flash memory devices in accordance with exemplary embodiments of the present invention.

Referring to FIG. 3, it is noted that embodiments of the present invention relate to the testing of flash memory dies 100 of flash memory devices 110B. During testing, the flash memory device 110B may be reversibly coupled to (for example, in order to exchange data with and/or to receive power from) a 'mass' testing board 114. Typically, each mass testing board includes a 'large' number of ports (for example, at least 100, or at least 200, or at least 500) for coupling with a plurality of flash memory devices 110B (for example, at least 100, or at least 200, or at least 500). Use of a 'mass' testing board 114 where a large number of devices may be tested substantially simultaneously may be useful for providing an economy of scale, thereby reducing the costs associated with the testing stage of device manufacture.

The flash memory device 110B includes a flash memory residing on one or more flash memory dies 100 (each flash memory die 100 having a plurality of flash memory cells), and a flash controller residing on a flash controller die 102, separate from the flash memory dies 102. The flash controller is operative, for example, to read data from the flash cells and/or to write data to the flash cells. Other exemplary functionality of the flash controller may include error detection and/or correction and providing an interface (including but not limiting to a NAND interface and a USB interface) through which a separate device (for example, a host device such as a microcomputer) may access the memory cells (read access and/or write access) of the flash memory die 100.

As illustrated in FIG. 3, the flash controller 102 is depicted as controlling and testing a single flash memory die 100. Nevertheless, it is noted that embodiments where the flash controller 102 is configured to test a plurality of flash memory dies 100 (for example, all together in or on the common housing 112) are also contemplated by the present inventors.

It is noted that each flash memory die of a respective flash memory device 110B together with a respective flash controller die 102 is associated with a respective "housing" 112. As used herein, when one or more dies are "associated" with a "housing," each of the dies either: (a) reside within the housing (b) reside on the housing (c) are attached to the housing, or (d) any combination thereof.

The term "housing" is intended to include both the packaging of multi-chip packages (i.e. both the flash memory die 100 and a flash controller die 102 reside together within the multi-chip package) as well as the board of a printed circuit board (i.e. where both the flash memory die and the flash controller reside together on the same printed circuit board).

There are a number of possible reasons for including the flash controller and the flash memory die 100 together within a common housing 112, including:

a. In many applications, it may not be useful to operate the flash device without a controller. For example, if the flash technology has low reliability that results in a high error rate. This is the case with an MBC flash technology that stores a large number of bits per cell, for example four or more bits per cell. In this case it is not useful to connect the flash device directly to a host processor, as the large number of errors will make the data read by the host useless. Instead, a dedicated flash controller is connected between the flash device and the host, and the controller implements an Error Correction Code scheme. The controller exports to the host an error-free flash device, to which the host interfaces using the same interface it would have used for interfacing to the stand-alone flash device, if it would not have the errors. Such an arrangement is disclosed in U.S. patent application Ser. No. 11/326,336 of one of the present inventors (Lasser), entitled "A NAND FLASH MEMORY CONTROLLER EXPORTING A NAND INTERFACE" filed on Jan. 6, 2006, incorporated by reference for all purposes as if fully set forth herein. The controller die and the flash memory die (or dies) can then be packaged together as an MCP device and sold as one component.

b. In many cases it is more convenient to interface the host processor to the memory device using some standard interface. For example, a host processor may have a built-in USB interface, and it is desirable to have the flash memory accessed through this interface. The flash memory may be on the same board as the processor, or it may be in a removable memory device such as a USB Flash Drive (USB) like the DiskOnKey offered for sale by M-Systems Flash Disk Pioneers of Kfar-Saba, Israel. In such case there is a need for a USB controller to connect between the host processor and the flash memory die (or dies). The USB controller interfaces to the flash device using the appropriate flash interface, and interfaces to the host using a USB interface. Here too the USB controller die and the flash memory dies can be packaged together as an MCP device and sold as one component.

Testing the Flash Memory Die

After a flash memory die 100 is operatively linked with a controller 102 (for example, after the die and the controller are assembled within a common housing 112), it is possible to use to advantage the processing power of the controller 102. Instead of carrying out all tests of the flash memory die by test equipment (in particular, using processor 108 of the prior art memory tester 106), some or all of these tests may be carried out by the flash controller residing on the flash controller die 102. Thus, as shown in FIG. 3, the processor 104 of flash controller 102, which is configured to execute one or more test programs, is marked with an asterisk.

One non-limiting example of testing that may be carried out using the flash controller 102 is bad blocks testing. This type of testing does not require measurement of timing, of analogue signals (like currents or voltages) or other complex tasks. All that is required for bad blocks testing is issuing commands for erasing blocks, writing and reading data, and then comparing the read data to the written data. This is within the capability of even a simple processor, of the type typically found in flash controllers. For example, the comparing may be carried out, for example, by an ALU of the processor 104 of the flash controller.

Typically, when bad block testing is carried out during the manufacturing process, most or all flash memory cells are tested (rather than testing just a representative sample). This helps to ensure that a high quality flash device will be shipped and sold as original equipment.

Thus, in various embodiments, a majority of blocks of a given flash memory die 100 are subjected to bad block testing using a test program executed by the flash controller 102. In some embodiments, a large majority (i.e. at least 75% of blocks of a given flash memory die 100), or substantially all (i.e. at least 90% of blocks of a given flash memory die 100), or all blocks of a given flash memory die are subjected to bad block testing using the flash controller 102.

While embodiments relating to the case where testing of the flash memory occurs close in time to the manufacturing of the flash memory dies have been described, the invention is not limited to this case. Instead of selling an MCP device or an assembled memory card, a flash memory manufacturer may sell a chipset of the two (or more) dies—a controller die and a flash memory die (or dies). A chipset is a set of dies intended to be used together. The buyer of the chipset then installs these chips on a memory card or in another type of product. In this case the testing of the flash only occurs at the buyer's place, when the assembled card is first powered up. After testing, the buyer of the chipset may then sell the assembled card as original equipment.

Mass Testing Board 114

An additional advantage of such an arrangement (i.e. described in FIG. 3) may be in the structure of the testing boards. Since the flash devices are individually tested by their controllers, there is no need for using memory testers and hence the following benefits may be achieved:

The testing boards may be designed to accommodate a large number (for example, at least 100, or at least 200, or at least 500) of devices, all of which are simultaneously tested in a mass testing process. As used herein, a 'mass testing process' is a batching testing process carried out on a large number of devices (for example, at least 100, or at least 200, or at least 500) substantially simultaneously. It is noted that mass testing processes can, in turn, reduce the testing cost.

The testing board's complexity may be reduced. Thus, instead of interfacing to a memory tester with tight constraints on circuit design and implementation, the testing board 114 may have to provide the devices only with power and a simple interface to the test controller (e.g. a Personal Computer may be used to host the testing board).

Manufacturing, Testing and Shipping of Flash Devices

A typical embodiment of the present invention for testing flash devices during a manufacturing process in a manufacturing facility includes the following steps:

a. A wafer with multiple flash memory dies is manufactured.

b. A wafer sort testing stage is done on the wafer. Only basic "go/nogo" tests are done for each die. Dies that fail are marked as bad and are removed from further processing.

c. The wafer is cut into dies.

d. Flash memory dies are matched with a controller die and assembled into a multi-chip package (MCP).

e. The MCP devices are installed on testing boards, the testing boards are put into a testing set-up and power is applied to them. The testing set-up may be a simple station, such as a Personal Computer (PC).

f. Within each MCP device the controller starts executing code, typically from ROM memory within the controller.

g. Each controller tests its matching flash memory die or dies. Bad blocks that are found are recorded in the flash memory, either in the relevant blocks or in a central list of all bad blocks. Other tests, in addition to the bad blocks testing, may also be done.

h. The testing station reads the results of the tests for each device as reported by its controller. Devices that failed (for example by having too many bad blocks) are identified. Devices that passed the test get their bad blocks marked as required according to their specifications. For example, each bad block may be marked by having certain bytes of its first page be written to "0".

It should be noted that the testing of a flash memory die 100 by a controller 102 is not limited to testing of bad blocks—any test (for example, a test that does not require special equipment and may easily be implemented in a controller's processor) may be carried out, saving additional testing costs.

After testing in the manufacturing facility, the flash memory device 110, may, in some embodiments, be shipped and sold as 'original equipment.' This original equipment includes the one or more flash memory dies 100, operatively linked within a common housing 112 to the flash controller 102 that was used to execute the test program of the flash memory die(s) 100. Thus, it may be important, in some embodiments, to carry out a thorough testing of bad blocks in the device, as described above, before shipping from the manufacturing facility. 'Original equipment' refers to an electronics product that has never been distributed to 'end users.' Thus, as used herein, 'original equipment' refers to equipment where 'user data' (i.e. data different from data written to the flash memory cells in the context of testing the flash device and/or configuring the flash device (i.e. 'preloading' software to the flash device)) has never been written.

Storage of Computer-Readable Code for Testing Memory Cells of the Flash Memory Die 100

It is noted that the testing program executed by the flash controller 102 may be stored in any non-volatile memory, volatile memory and/or any combination thereof. Thus, in one example, the testing program is stored in ROM within the controller 102. According to another example, it is possible to store the testing program in the flash device and have the controller load the test program into its RAM on power-up and then execute it. In such case the testing program is written into the flash memory at the end of the wafer sort stage.

In some embodiments, it is desirable that the flash memory device 110 be configured such that the controller 102 does not run the tests every time the device is powered-up but only on the first time. This may be particularly desirable for cases where the test program includes directives to effect 'thorough' or 'massive' bad block testing (i.e. at least a majority of the flash memory cells of a flash memory die 100). Towards this end, in some embodiments, the device 110 is configured such that once the controller 102 completes the testing, the controller 102 sets a flag in the flash memory (i.e. in one or more memory cells of the flash memory die 100) that indicates a particular testing stage was already done. Upon device power-up, the controller 102 may check this flag (for example, the controller 102 always checks this flag upon device power-up), and runs the testing program only if the flag is not set.

Figure 4:
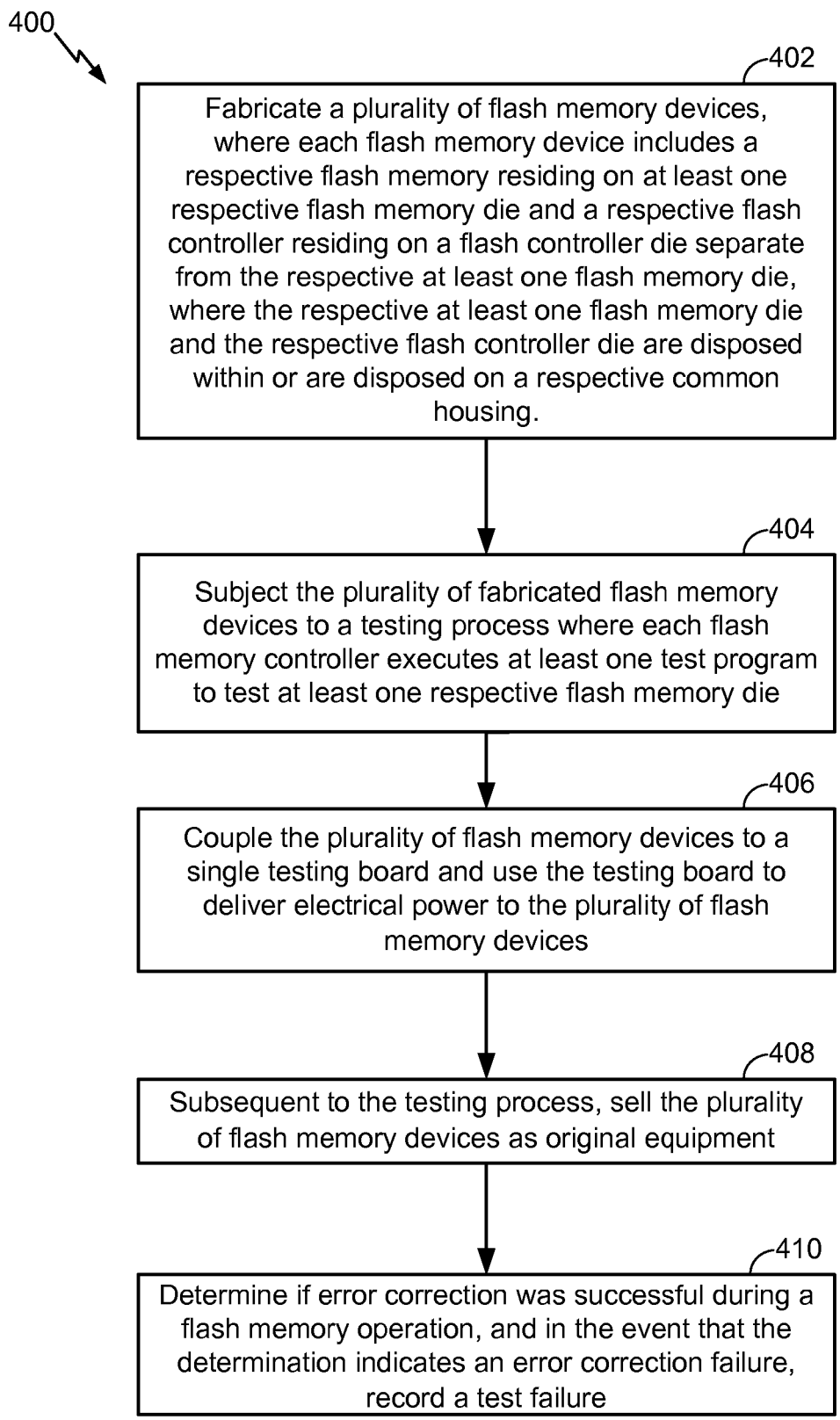
FIG. 4 provides a flow diagram of a method of device manufacturing in accordance with an embodiment of the present disclosure.

Referring to FIG. 4, an illustrative embodiment of a method of device manufacturing is depicted and generally designated 400. The method 400 includes fabricating a plurality of flash memory devices, at 402. Each flash memory device includes a respective flash memory residing on at least one respective flash memory die and a respective flash controller residing on a flash controller die separate from the respective at least one flash memory die. The respective at least one flash memory die and the respective flash controller die are associated with a respective common housing. The method further includes subjecting the plurality of fabricated flash memory devices to a testing process where each flash memory controller executes at least one test program to test at least one respective flash memory die, at 404. In an embodiment, the testing process is a mass testing process.

The method further includes coupling the plurality of flash memory devices to a single testing board, and using the testing board to deliver electrical power to the plurality of flash memory devices, at 406. The method further includes, subsequent to the testing process, selling the plurality of flash memory devices as original equipment, at 408.

Each flash memory device may be fabricated as a respective multi-chip package or as a respective memory card. Each of the flash memory controller and the flash memory may be provided within a common respective multi-chip packaging. Each flash memory of a respective flash memory device may comprise a plurality of flash memory dies, and each respective flash controller may test a respective plurality of flash memory dies by executing at least one test program. For each flash memory device, a respective flash controller and a respective flash memory die may be provided on a respective common printed circuit board. In a particular embodiment, for each flash memory device, at least one test program may reside at least in part within non-volatile memory of a respective flash controller. In another alternate embodiment, for each flash memory device, the test program may reside at least in part within the respective flash memory. In another alternate embodiment, at least one test program executed by each said flash controller identifies bad blocks in the respective flash memory. In another alternate embodiment, at least one test program executed by each flash controller affects bad block testing of a majority of memory cells of a respective flash memory. In yet another alternate embodiment, at least one test program executed by each flash controller affects bad block testing of a large majority of memory cells of a respective flash memory. In another alternate embodiment, at least one test program executed by each flash controller affects bad block testing of substantially all memory cells of a respective flash memory. In yet another alternate embodiment, at least one test program executed by each flash controller tests memory cells of a respective flash memory in a multi bit per cell mode.

The method further includes determining if error correction was successful during a flash memory operation, and in the event that the determination indicates an error correction failure, the method records a test failure, at 410.

The method provided by certain embodiments of the present invention saves costs of flash memory testing because time-consuming tests such as bad blocks testing may be carried out using simple and cheap equipment, unlike in prior art methods. Even though when a flash device fails we lose the cost of its accompanying controller and package, the saving in testing costs more than compensates for this loss.

Use of an ECC

In many devices, the flash controller residing on the flash controller 102 die includes an ECC. Thus, in some embodiments, the ECC may also be used during testing. For example, the ECC may be used in the testing, and if the ECC reports a failure to correct the data, the test program reports a test failure. In many embodiments, this may obviate the need to compare each bit of the data to it's "true" value. Thus, according to these embodiments, it is possible to query the ECC circuitry for a "YES/NO" result with out incurring a time penalty associated with comparing data bits.

Thus, in one example, it may be decided that the occurrence of two bit errors in a page should not be taken as a failure of the page because the ECC in use is capable of correcting two errors. Implementing such criteria in prior art test equipment is cumbersome and expensive. When running the tests using the controller, this becomes very simple—one may let the controller 102 correct the data it reads from the flash, and only if the controller 102 fails to correct the errors, is a failure reported.

Additional Discussion

In some embodiments, where flash memory devices use both SBC and MBC modes and both modes should be tested, SBC and MBC tests may be separated between the testing stages. Thus, according to some examples, testing of the flash cells in the wafer sort stage includes testing the cells in SBC mode, which is a fast operation. Testing the flash cells in MBC mode, which is a relatively long operation, is delayed to the MCP stage. Of course, other variations of this division are possible—for example doing a small sample of MBC tests in the wafer sort stage, and carrying out the bulk of MBC tests in the MCP stage.

It is noted that the present invention is not limited to MCP devices. Any method in which the controller and the flash memory are brought into contact, and in which the controller is used for executing tests of the flash memory, is included within the scope of the invention. For example, when manufacturing memory cards such as SecureDigital ("SD") or MultiMediaCards ("MMC"), a flash memory device (or devices) and a controller are installed on a small card. The components may be packaged dies or bare dies. In this case the card takes the place of the MCP, and servers as the common 'housing' 112—when the cards are powered-up the controller executes a flash testing program as described above.

Although NAND-type floating-gate flash memory devices have been explicitly mentioned, the present invention relates to any other flash memory technology such as NOR-type floating-gate flash memory or NROM-type flash memory that does not use a floating gate.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

All references cited herein are incorporated by reference in their entirety. Citation of a reference does not constitute an admission that the reference is prior art.

The articles "a" and "an" are used herein to refer to one or to more than one (i.e., to at least one) of the grammatical object of the article. By way of example, "an element" means one element or more than one element.

The term "including" is used herein to mean, and is used interchangeably with, the phrase "including but not limited" to.

The term "or" is used herein to mean, and is used interchangeably with, the term "and/or," unless context clearly indicates otherwise.

The term "such as" is used herein to mean, and is used interchangeably, with the phrase "such as but not limited to".

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art.

What is claimed is:

1. A method of device manufacturing comprising:
   a) fabricating a plurality of flash memory devices, each said flash memory device including:
      (i) a respective flash memory residing on at least one respective flash memory die and
      (ii) a respective flash controller residing on a flash controller die separate from said respective at least one flash memory die, said respective at least one flash memory die and said respective flash controller die residing within, residing on, or attached to a common housing,
   b) subjecting said plurality of fabricated flash memory devices to a testing process wherein a testing board is coupled to each of said plurality of fabricated flash memory devices and wherein each said flash memory controller executes at least one test program to test at least one respective said flash memory die while the flash memory device including said flash memory die is coupled to the test board.

2. The method of claim 1 wherein said testing process is a mass testing process.

3. The method of claim 2 wherein said subjecting of said flash memory devices to said mass testing process includes coupling said plurality of flash memory devices to a single testing board, and using said testing board to deliver electrical power to said plurality of flash memory devices.

4. The method of claim 1 further comprising: c) subsequent to said testing process, selling said plurality of flash memory devices as original equipment.

5. The method of claim 4 wherein each said flash memory device is fabricated as a respective multi-chip package.

6. The method of claim 4 wherein each said flash memory device is fabricated as a respective memory card.

7. The method of claim 1 wherein each of said flash memory controller and flash memory is provided within a common respective multi-chip packaging.

8. The method of claim 1 wherein each said flash memory of a respective said flash memory device comprises a plurality of flash memory dies, and each respective said flash controller tests a respective said plurality of flash memory dies by executing said at least one test program.

9. The method of claim 1 wherein for each said flash memory device, a respective said flash controller and a respective said at least one flash memory die are provided on a respective common printed circuit board.

10. The method of claim 1 wherein for each said flash memory device, at least one said test program resides at least in part within non-volatile memory of a respective said flash controller.

11. The method of claim 1 wherein for each said flash memory device, said test program resides at least in part within said respective flash memory.

12. The method of claim 1 wherein at least one said test program executed by each said flash controller identifies bad blocks in said respective flash memory.

13. The method of claim 1 wherein at least one said test program executed by each said flash controller affects bad block testing of a majority of memory cells of a respective said flash memory.

14. The method of claim 1 wherein at least one said test program executed by each said flash controller affects bad block testing of substantially all memory cells of a respective said flash memory.

15. The method of claim 1 wherein at least one said test program executed by each said flash controller tests memory cells of a respective said flash memory in a multi bit per cell mode.

16. The method of claim 1 wherein said execution of said at least one test program includes:
   performing an error correction;
   i) determining if the error correction was successful during a flash memory operation; and
   ii) in the event that said determining indicates an error correction failure, recording a test failure.

17. A testing system comprising:
   a) a plurality of at least 100 flash memory devices, each said flash memory device including a respective flash memory residing on a respective at least one flash memory die and a respective flash controller residing on a respective flash controller die separate from said respective at least one flash memory die, said respective at least one flash memory die and said respective flash controller die residing within, residing on, or attached to a common housing, each said flash memory controller operative to execute at least one test program to test a respective at least one said flash memory die; and
   b) a mass-testing board having at least 100 ports configured to supply electrical power to said flash memory devices such that each said port supplies electrical power to a respective said flash memory device.

18. The system of claim 17 wherein at least one said test program executed by each said flash controller is operative to affect bad block testing of a majority of memory cells of a respective said flash memory.

19. The system of claim 17 wherein at least one said test program executed by each said flash controller is operative to affect bad block testing of substantially all memory cells of a respective said flash memory.

20. The system of claim 17 wherein the system is operative to test said plurality of at least 100 flash memory devices substantially simultaneously.

21. The system of claim 17 wherein each said flash memory controller is operative to execute at least one test program to test a respective at least one said flash memory die while the flash memory device including the flash memory die is coupled to the mass-testing board.

* * * * *